United States Patent
Tamagaki et al.

(10) Patent No.: US 9,562,290 B2
(45) Date of Patent: Feb. 7, 2017

(54) PLASMA CVD APPARATUS

(75) Inventors: Hiroshi Tamagaki, Takasago (JP); Tadao Okimoto, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 504 days.

(21) Appl. No.: 13/814,945

(22) PCT Filed: Oct. 27, 2011

(86) PCT No.: PCT/JP2011/006022
§ 371 (c)(1),
(2), (4) Date: Feb. 8, 2013

(87) PCT Pub. No.: WO2012/056707
PCT Pub. Date: May 3, 2012

(65) Prior Publication Data
US 2013/0133577 A1 May 30, 2013

(30) Foreign Application Priority Data
Oct. 29, 2010 (JP) .................... 2010-243717

(51) Int. Cl.
C23C 16/54 (2006.01)
C23C 16/44 (2006.01)
(Continued)

(52) U.S. Cl.
CPC ......... C23C 16/545 (2013.01); C23C 16/4401 (2013.01); C23C 16/50 (2013.01); H01J 37/3277 (2013.01)

(58) Field of Classification Search
CPC  C23C 16/545; H01J 37/3277; H01J 37/32761
See application file for complete search history.

(56) References Cited

U.S. PATENT DOCUMENTS 4,220,117 A * 9/1980 Shinohara .................. 118/718
5,016,561 A * 5/1991 Tokai et al. ................ 118/718
(Continued)

FOREIGN PATENT DOCUMENTS

JP         2587507 B2     3/1997
JP         2001 49443     2/2001
(Continued)

OTHER PUBLICATIONS

International Search Report Issued Jan. 10, 2012 in PCT/JP11/06022 Filed Oct. 27, 2011.

*Primary Examiner* — Karla Moore
*Assistant Examiner* — Charlee Bennett
(74) *Attorney, Agent, or Firm* — Oblon, McClelland, Maier & Neustadt, L.L.P.

(57) ABSTRACT

A plasma CVD apparatus capable of preventing unnecessary deposition on a supplying portion of a source gas so as to suppress generation of flakes, and thereby depositing a CVD coating excellent in quality is provided. This plasma CVD apparatus includes a vacuum chamber, a vacuum pump system for vacuuming an interior of the vacuum chamber, a deposition roller around which a substrate is wound, the deposition roller being provided in the vacuum chamber, a gas supplying portion for supplying the source gas to the interior of the vacuum chamber, and a plasma power supply for forming a plasma generating region in the vicinity of a surface of the deposition roller and thereby depositing a coating on the substrate. The gas supplying portion is provided in a plasma non-generating region positioned on the opposite side of the plasma generating region with respect to the deposition roller.

8 Claims, 7 Drawing Sheets

(51) Int. Cl.
  *C23C 16/50*  (2006.01)
  *H01J 37/32*  (2006.01)

(56) References Cited

U.S. PATENT DOCUMENTS

| | | | |
|---|---|---|---|
| 5,437,725 A * | 8/1995 | Schuster et al. | 118/718 |
| 8,092,600 B2 * | 1/2012 | Fujinawa et al. | 118/718 |
| 8,303,714 B2 * | 11/2012 | Tamagaki | 118/718 |
| 2004/0135485 A1 | 7/2004 | Madocks | |
| 2004/0149574 A1 | 8/2004 | Madocks | |
| 2004/0155592 A1 | 8/2004 | Madocks | |
| 2010/0313810 A1 | 12/2010 | Tamagaki | |
| 2011/0052924 A1* | 3/2011 | Oishi | 428/447 |
| 2012/0174864 A1* | 7/2012 | Tamagaki et al. | 118/718 |
| 2013/0269610 A1* | 10/2013 | Tamagaki et al. | 118/723 R |

FOREIGN PATENT DOCUMENTS

| | | |
|---|---|---|
| JP | 2003-013237 A | 1/2003 |
| JP | 2005-504880 A | 2/2005 |
| JP | 2006 299361 | 11/2006 |
| JP | 2006-316299 A | 11/2006 |
| JP | 2008 196001 | 8/2008 |
| JP | 4268195 B2 | 5/2009 |
| JP | 2009 127063 | 6/2009 |
| JP | 2009 174001 | 8/2009 |

\* cited by examiner

PLASMA CVD APPARATUS

TECHNICAL FIELD

The present invention relates to a plasma CVD apparatus for depositing a CVD coating on a substrate such as a plastic film and a plastic sheet.

BACKGROUND ART

In recent years, a plastic film used for packaging food is strongly required to have a vapor and oxygen-proof characteristic (barrier property). In order to provide a high barrier property to a sheet material such as a plastic film, there is a need for coating the sheet material with a transparent film of $SiO_x$, $Al_2O_3$, or the like. Conventionally, as a coating technique of a SiOx film, there are physical vapor deposition methods (PVD methods) such as a vacuum vapor deposition method and a sputtering method. However, in recent years, a plasma CVD method superior in terms of deposition speed and deposition of a high barrier coating in comparison to the above techniques is used.

As a plasma CVD apparatus used in this plasma CVD method, for example there are known apparatuses shown in Patent Documents 1 to 3.

A plasma CVD apparatus described in Patent Document 1 utilizes Penning discharge, and includes a vacuum chamber and a pair of deposition rollers provided in an interior of this vacuum chamber. These deposition rollers convey a substrate in a state that the substrate is wound between the deposition rollers. One pole of a high-frequency AC power supply is connected to these deposition rollers in such a manner that the deposition rollers have the same polarity. Meanwhile, an anti-pole of an annular electrode is disposed separately from the deposition rollers at a position which is away from a center of a space between the deposition rollers (hereinafter, referred to as the inter-roll space) by a substantially equal distance to each other. The other pole of the high-frequency power supply is connected to this anti-pole.

In this plasma CVD apparatus, by supplying high-frequency power of tens of or hundreds of kHz between the deposition rollers and the anti-pole, a magnetic field is generated so as to range between the deposition rollers, and discharge (Penning discharge) is generated in the inter-roll space. This discharge ionizes a source gas in the vacuum chamber and generates plasma so as to realize plasma CVD. That is, a coating is deposited on a surface of the substrate wound between the deposition rollers.

However, in this apparatus of Patent Document 1, there is a possibility of a trouble caused by deposition on the anti-pole. That is, in this apparatus, the annular electrode is used as the anti-pole in addition to the deposition rollers, and the power is supplied to this anti-pole from the high-frequency power supply. Thus, there is a fear that plasma is also generated and a coating is deposited on a surface of the anti-pole. There is a possibility that the coating deposited on the anti-pole in such a way is peeled off and mixed into the original CVD coating as flakes, so that quality of the CVD coating is lowered.

Patent Document 2 discloses a plasma CVD apparatus which is different from the apparatus described in Patent Document 1 in which the anti-pole is provided in addition to the deposition rollers and the power supply is connected between these, the plasma CVD apparatus including first and second deposition rollers provided in line in the horizontal direction, capable of generating plasma with one of the deposition rollers serving as an acting pole and the other deposition roller serving as an anti-pole. Specifically, an anode and a cathode of a plasma power supply are respectively connected to the first and second deposition rollers, and thereby, both the deposition rollers are alternately used as the acting pole and the anti-pole. A substrate is wound around surfaces of the deposition rollers. Thus, even when a CVD coating is deposited on the substrate, due to the deposition rollers serving as the only anti-pole, generation of flakes due to the deposition is suppressed.

Particularly, in this plasma CVD apparatus described in Patent Document 2, a space between both the deposition rollers is physically isolated from other spaces so as to form a discharge chamber, and plasma is generated and a coating is deposited mainly inside this discharge chamber. Thus, the generation of the flakes on the outside of the discharge chamber is prevented. Specifically, partition walls surrounding the discharge chamber are opened toward the sides of the deposition rollers. The openings of the discharge chamber are closed by the deposition rollers, and a vacuum degree in the discharge chamber is maintained at a pressure suitable for generation of plasma by supplying a source gas, so that the deposition is performed. Thereby, discharge is performed only in the discharge chamber. Thus, the generation of the flakes on the outside of the discharge chamber is prevented.

However, in the deposition apparatus described in Patent Document 2, although the flakes are not generated on the outside of the discharge chamber, the coating is easily attached to wall surfaces surrounding the discharge chamber, and there is a fear that the flakes generated on the wall surfaces are mixed into the CVD coating, so that quality of the coating is lowered. Further, in order to perform the deposition in this apparatus, there is a need for supplying the source gas into the discharge chamber so as to lower the vacuum degree in the discharge chamber. Therefore, there is a need for maintaining a gap between the partition walls surrounding the discharge chamber and the deposition rollers to be small so as to retain airtightness of the discharge chamber. However, when the coating is accumulated in the vicinity of this gap and size of the gap is changed, the airtightness of the discharge chamber is not easily retained and stability of the deposition is deteriorated. Thus, there is a fear that the quality of the CVD coating is lowered.

Patent Document 3 discloses an apparatus including a pair of hollow deposition rollers and magnetic field generating means provided inside the deposition rollers for generating a magnetic field, wherein plasma is generated only in a magnetic field region formed by the magnetic field generating means. Each of the magnetic field generating means has an N-pole magnet and an S-pole magnet. These magnets are spaced from each other so as to protrude toward a space between the deposition rollers, and form a magnetic field having a magnetic line coming from one magnetic pole in the deposition roller to an exterior of the deposition roller and returning again to the other magnetic pole in the deposition roller. Plasma is generated only in a region along the magnetic field.

With this deposition apparatus described in Patent Document 3, the region where plasma is generated can be limited to part of surfaces of the deposition rollers where the magnetic field is generated. However, the plasma reaches to a supplying portion of a source gas and is accumulated in the vicinity of the supplying portion so as to be flakes, and the flakes are dropped and mixed into a CVD coating. Thus, there is a possibility that quality of the coating is adversely influenced.

CITATION LIST

Patent Document

Patent Document 1: Japanese Unexamined Patent Application Publication No. 2005-504880
Patent Document 2: Japanese Patent No. 2587507
Patent Document 3: Japanese Unexamined Patent Application Publication No. 2008-196001

SUMMARY OF INVENTION

Technical Problem

An object of the present invention is to provide a plasma CVD apparatus capable of preventing unnecessary deposition on a supplying portion of a source gas so as to suppress generation of flakes, and thereby depositing a CVD coating excellent in quality. This plasma CVD apparatus includes a vacuum chamber whose interior is hollow, a vacuum pump system for vacuuming the interior of the vacuum chamber, a deposition roller around which a substrate serving as a deposition object is wound, the deposition roller being disposed in the vacuum chamber, a gas supplying portion for supplying the source gas to the interior of the vacuum chamber, and a plasma power supply for forming a plasma generating region in the vicinity of a surface of the deposition roller and thereby depositing a coating on the substrate wound around the deposition roller, wherein the gas supplying portion is provided in a plasma non-generating region positioned on the opposite side of the plasma generating region with respect to the deposition roller.

DESCRIPTION OF EMBODIMENTS

Figure 1:
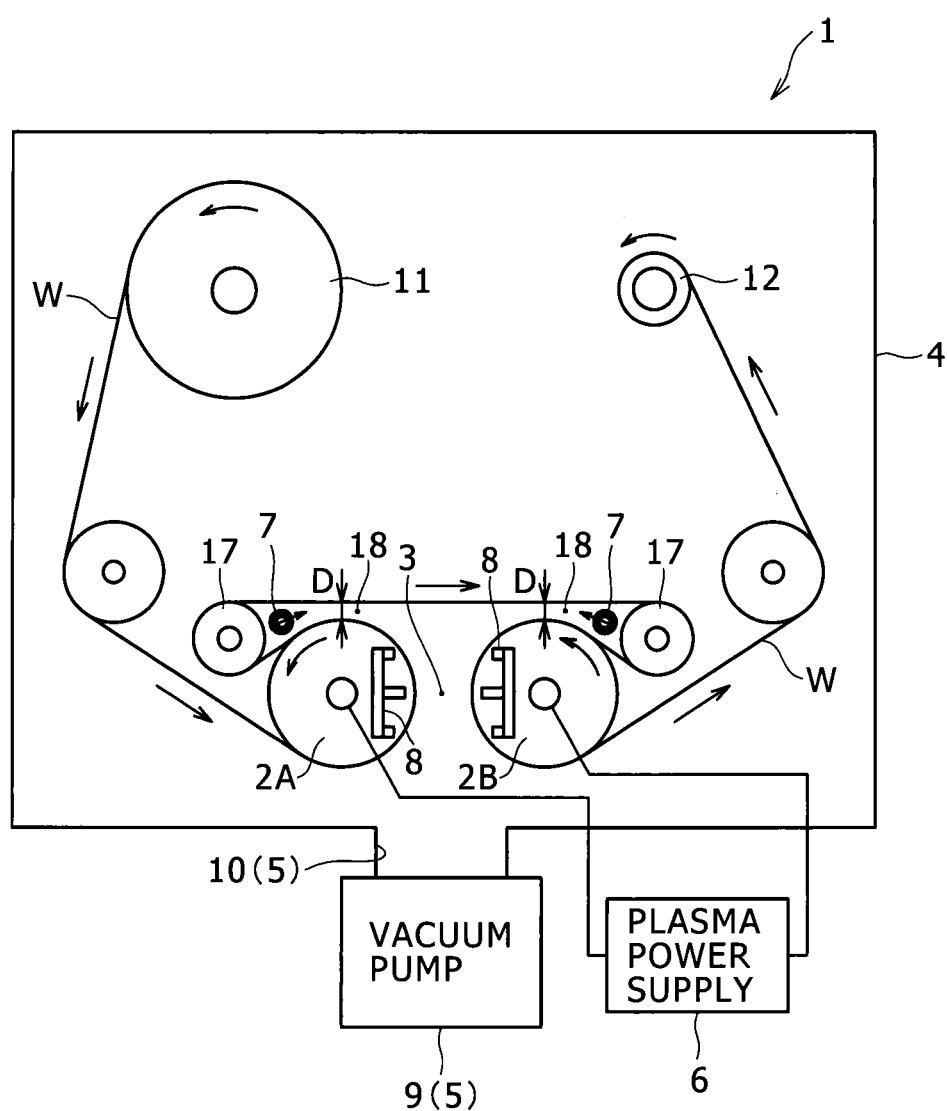
FIG. 1 A front view of a plasma CVD apparatus according to a first embodiment of the present invention.

A first embodiment of the present invention will be described with reference to FIGS. 1 to 5.
FIG. 1 shows an entire configuration of a plasma CVD apparatus 1 according to a first embodiment of the present invention. The plasma CVD apparatus 1 of the present embodiment includes a pair of first deposition roller 2A and second deposition roller 2B, a vacuum chamber 4, a vacuum pump system 5, a plasma power supply 6, and magnetic field generating portions 8.

The first and second deposition rollers 2A, 2B are arranged so as to face each other with a space 3 between the deposition rollers in the vacuum chamber 4 whose interior can be airtight, and a sheet shape substrate W is wound around these deposition rollers. When an AC voltage or a pulse voltage accompanied by polarity reversal is applied to both the deposition rollers 2A, 2B in a state that pressure is reduced in the vacuum chamber 4, a glow discharge is generated in the space 3 between both the deposition rollers 2A, 2B, so that a coating is deposited on the substrate W by plasma CVD.

The vacuum pump system 5 includes a vacuum pump 9 connected to an exhaust port 10 which is provided in a lower partition wall of the vacuum chamber 4, capable of exhausting the interior of the vacuum chamber 4 into a vacuum state or a low-pressure state equivalent to the vacuum state in accordance with a command from an exterior. The pressure can be adjusted so as to be suitable for a coating by an exhaust speed adjustment means (not shown).

The first and second deposition rollers 2A, 2B are arranged in such a manner that axes thereof are placed horizontally (toward the far side in FIG. 1) in parallel to each other and spaced from each other in the horizontal direction which is orthogonal to the axes. The deposition rollers 2A, 2B are driven and rotated in both the forward and reverse directions by a motor (not shown). Both poles of the plasma power supply 6 are respectively connected to the deposition rollers 2A, 2B.

The magnetic field generating portions 8 are provided inside the deposition rollers 2A, 2B, and generate magnetic fields in the space 3 between these deposition rollers 2A, 2B. In the magnetic fields, plasma P of a source gas is generated by the discharge. When the substrate W passes through in this plasma P, a CVD coating is deposited on a surface of the substrate W.

It should be noted that in this embodiment, the up and down direction of FIG. 1 is the up and down direction of the plasma CVD apparatus 1, and the left and right direction of FIG. 1 is the left and right direction of the plasma CVD apparatus 1.

The vacuum chamber 4 has gas supplying portions 7, and the source gas is supplied from the gas supplying portions 7 to the interior of the vacuum chamber 4 brought into the vacuum state or the low-pressure state by the vacuum pump system 5. Various materials are selected as this source gas in accordance with a type of the CVD coating to be deposited. For example, in the present embodiment, a SiOx barrier coating is deposited as the CVD coating, and therefore, a mixed gas including HMDSO (hexamethyldisiloxane) and $O_2$, He, Ar, $N_2$, $NH_3$, or a mixture of these substances is selected. In the present invention, except the HMDSO described above, an organic silicon source gas such as HMDS (N) (hexamethyldisilazane), TEOS (tetraethoxysilane), TMS (trimethylsilane, tetramethylsilane), and monosilane can also be used as the source gas. The interior of the vacuum chamber 4 is adjusted at pressure suitable for deposition by the exhaust speed adjustment means (not shown).

As the substrate W serving as a deposition object of the CVD coating, a non-conductive material capable of being taken up into a roll shape such as a plastic film, sheet, or paper can be used. The plastic film or sheet used as the substrate W includes PET, PEN, PES, polycarbonate, polyolefin, and polyimide. Thickness of the substrate W is preferably 5 μm to 0.5 mm with which the substrate can be conveyed in vacuum.

In this embodiment, a feeding roller 11 and a take-up roller 12 for conveying the substrate W are rotatably provided in the vacuum chamber 4. The substrate W is wound around the feeding roller 11 in a coil form, fed out from this feeding roller 11 to the space 3, and taken up by the take-up roller 12. The feeding roller 11 and the take-up roller 12 can be reversed. At the time of reversing, the take-up roller 12 serves as a feeding roller, and the feeding roller 11 serves as a take-up roller.

Figure 2:
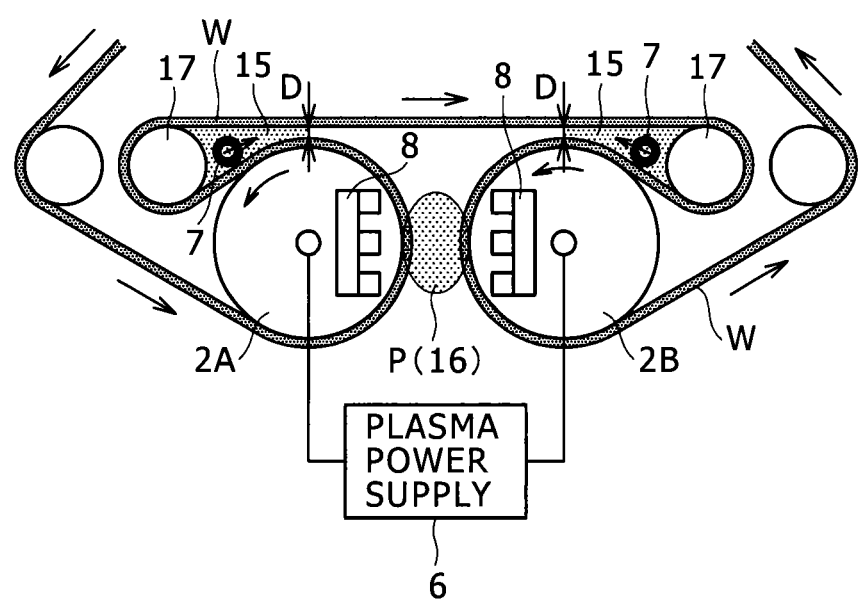
FIG. 2 A view showing a deposition process performed in the plasma CVD apparatus shown in FIG. 1.
Figure 3:
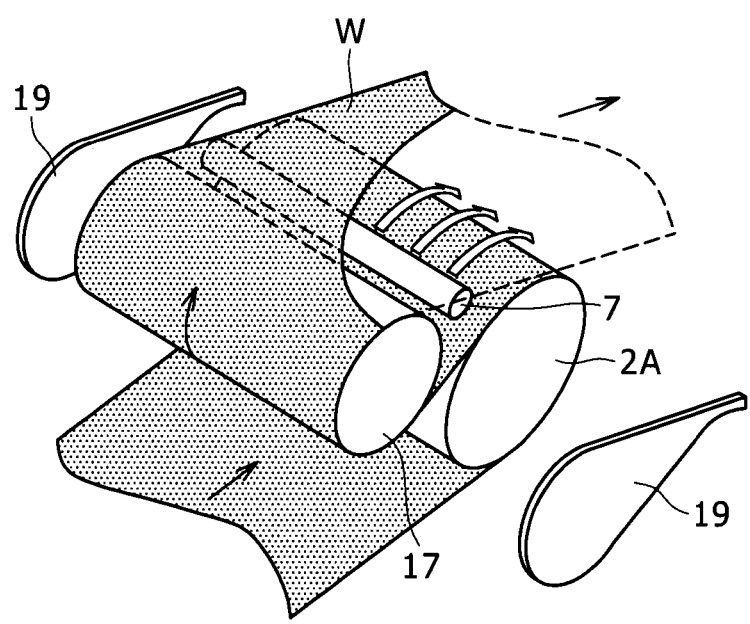
FIG. 3 A perspective view of the plasma CVD apparatus shown in FIG. 1.

As shown in FIGS. 1 to 3, the deposition rollers 2A, 2B are cylindrical bodies made of a stainless material or the like with the same diameter and the same length. The deposition rollers are installed in such a manner that rotation centers thereof are positioned at the substantially same height from a floor surface (upper surface of the lower partition wall) of the vacuum chamber 4. Both the deposition rollers 2A, 2B are horizontally spaced from each other in such a manner that the axes thereof are parallel to each other, and outer peripheral surfaces of both the rollers 2A, 2B face each other with the space 3 between the rollers.

In order to wind the substrate W having various width around the deposition rollers, the deposition rollers 2A, 2B have size in the width direction which is larger than the width of the substrate W having the largest width. A medium such as water whose temperature is adjusted can be distributed inside the deposition rollers 2A, 2B. Thereby, a temperature of surfaces of the rollers can be adjusted. Preferably, chrome plating or the like is performed so that the surfaces of the deposition rollers 2A, 2B are not easily damaged.

Both the deposition rollers 2A, 2B are electrically insulated from the vacuum chamber 4, and the deposition rollers 2A, 2B are also electrically insulated from each other via the space 3 as described above. One of the poles of the plasma power supply 6 is connected to one of the deposition rollers 2A, 2B, and the other pole is connected to the other deposition roller. That is, the plasma power supply 6 is connected to the deposition rollers so that the deposition rollers 2A, 2B indicate different polarities from each other.

Figure 4:
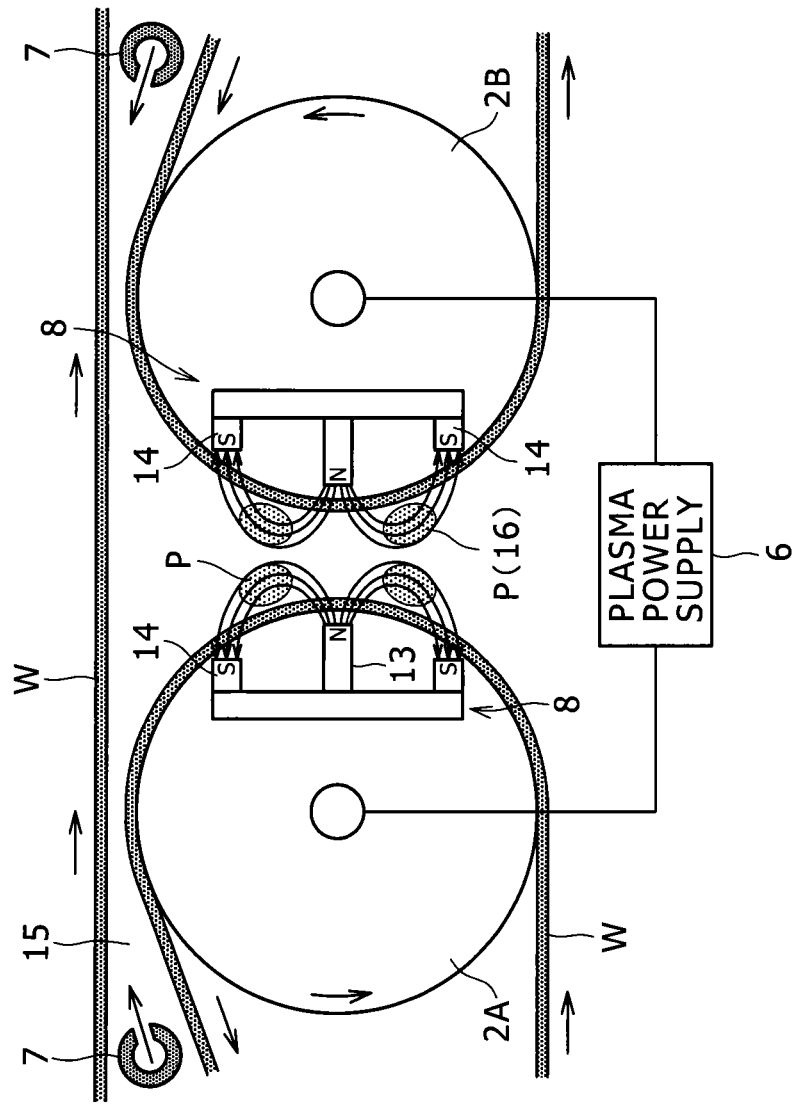
FIG. 4 An enlarged sectional view of a part where plasma is generated in the plasma CVD apparatus shown in FIG. 1.
Figure 5:
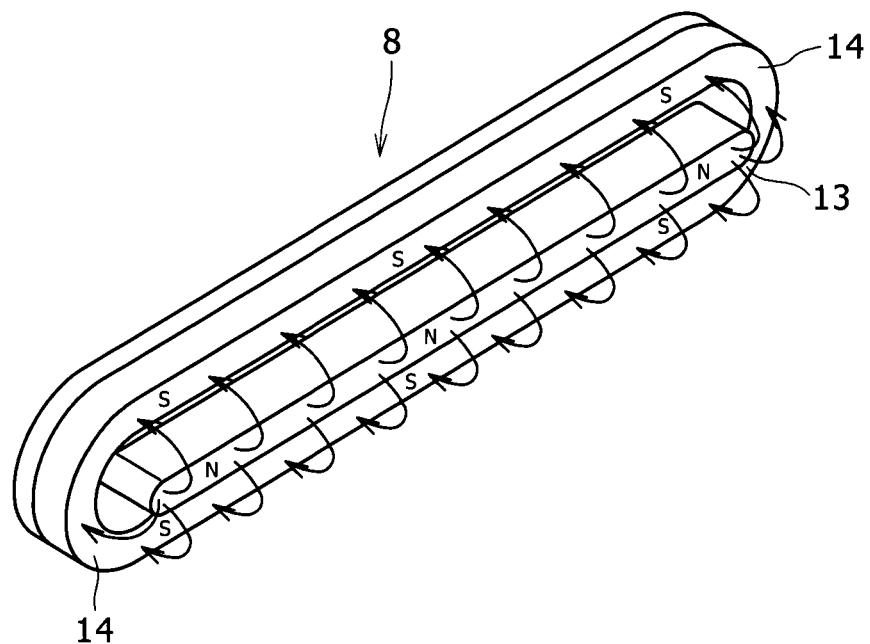
FIG. 5 A perspective view of a magnetic field generating member provided in the plasma CVD apparatus shown in FIG. 1.

As shown in FIGS. 4 and 5, the magnetic field generating portions 8 are disposed inside the deposition rollers 2A, 2B, include magnets for generating magnetic fields in the vicinity of the surfaces of these deposition rollers 2A, 2B, and have a function of converging the plasma P on the surfaces of the deposition rollers 2A, 2B, in more detail, on the surfaces facing each other with the space 3 between the surfaces by the generated magnetic fields. Specifically, each of the magnetic field generating portions 8 has a rod shape first magnet 13 extending along the parallel direction to the axis of the deposition roller 2, and a second magnet 14 formed in a shape surrounding this first magnet 13 when the first magnet is seen from the direction orthogonal to the longitudinal direction thereof. The first magnet 13 is provided at an intermediate position in the up and down direction in the magnetic field generating portion 8 in such a manner that an axis thereof is parallel to the axis of the deposition roller 2. The second magnet 14 is formed in for example a race-track shape, that is, the shape integrally having straight parts positioned on the upper and lower sides of the first magnet 13 in parallel to the first magnet, and semi-arc parts connecting ends of these straight parts. The second magnet is disposed so as to surround the first magnet while being spaced from the first magnet 13 on a perpendicular plane passing through the axis of the first magnet 13.

The first magnet 13 is provided in such a manner that magnetic poles thereof are placed in the direction perpendicular to the axis thereof, and a N pole thereof is placed on the side of the space 3 in the example of the figures. The second magnet 14 is provided in such a manner that magnetic poles thereof are placed in the opposite direction to the magnetic poles of the first magnet 13, and an S pole thereof is placed on the side of the space 3 in the example of the figures. That is, in the magnetic field generating portion 8, both the N pole of the first magnet 13 and the S pole of the second magnet 14 are placed on the side of the space 3. Both the magnets 13, 14 are arranged so as to form magnetic fields having curved magnetic lines coming from the N poles of the first magnets 13 inside the deposition rollers 2A, 2B to an exterior of the deposition rollers 2A, 2B and returning again to the S poles of the second magnets 14 provided inside the deposition rollers 2A, 2B while turning in an arc shape.

The plasma power supply 6 can generate an AC voltage of a high frequency or a pulse shape voltage (pulse shape DC voltage) in which polarities of both the poles are reversible. Both the poles of this plasma power supply 6 have a floating potential insulated from the vacuum chamber 4, and are respectively connected to the first and second deposition rollers 2A, 2B so as to apply a potential capable of generating the discharge between these deposition rollers 2A, 2B. Since the substrate W on which the coating is deposited is an insulating material as described above, an electric current cannot flow by application of the DC voltage. However, an electric current can flow with a voltage having a proper frequency (about 1 kHz or more, preferably 10 kHz or more) in accordance with thickness of the film (substrate W). There is no particular upper limit for the frequency. However, since a standing wave is formed with tens of MHz or more, the frequency is preferably tens of MHz or less.

This plasma CVD apparatus 1 is characterized by that the gas supplying portions 7 on which the coating is preferably not deposited are arranged in plasma non-generating regions 15 where the gas supplying portions are not in contact with the plasma P. Thereby, generation of flakes due to accumulation of unnecessary coatings on the gas supplying portions 7 or lowered quality of the CVD coating due to mixing of the generated flakes are reliably suppressed.

Next, the plasma non-generating regions 15 and the gas supplying portions 7 provided in the plasma non-generating regions 15 will be described in detail.

A plasma non-generating region in the present invention is a region where a member arranged in the region is not at all or almost not in contact with plasma generated in a plasma generating region in a vacuum chamber. As shown in FIG. 2, each of the plasma non-generating regions 15 according to this embodiment is set in a region on the opposite side of a plasma generating region 16 between the deposition rollers 2A, 2B with respect to each of the deposition rollers 2A, 2B. That is, each of the plasma non-generating regions is set in the region hidden behind each of the deposition rollers 2A, 2B when seen form the plasma generating region 16.

The plasma CVD apparatus 1 according to this embodiment further includes guide rollers 17 respectively provided in correspondence with the deposition rollers 2A, 2B. These guide rollers 17 are rolls insulated from the plasma power supply 6 so as not to receive power supply. Each of the guide rollers is provided at a position on the opposite side of the plasma generating region 16 with respect to the deposition roller 2 so as to be rotated in the forward and reverse directions. In this embodiment, as shown by a grey-hatched region in FIG. 2, each of the plasma non-generating regions 15 in which the gas supplying portions 7 are arranged is set in a region surrounded by the guide roller 17, an upstream part of the substrate W serving as a part conveyed toward the guide roller 17, and a downstream part of the substrate W fed from the guide roller 17. It should be noted that when the substrate W is conveyed in the opposite direction to arrows of FIG. 1, the upstream part and the downstream part thereof become opposite to each other.

As shown in FIGS. 2 and 3, the guide roller 17 is arranged in such a manner that a rotation center axis thereof is parallel to a rotation center axis of the deposition roller 2. Specifically, the substrate W fed out from the first deposition roller 2A is wound around the guide roller 17 provided for the first deposition roller 2A on the upstream side (on the left side in FIG. 2) in the conveying direction of the substrate W (such as the plate passing direction or the coating passing direction) among both the deposition rollers 2A, 2B, and fed out from this guide roller 17 to the guide roller 17 provided for the second deposition roller 2B on the downstream side. The substrate W fed out from the guide roller 17 provided for the first deposition roller 2A on the upstream side thereof is wound around the guide roller 17 provided for the second deposition roller 2B on the downstream side (on the right side in FIG. 2) in the conveying direction of the substrate W among both the deposition rollers 2A, 2B, and fed from this guide roller 17 to the second deposition roller 2B on the downstream side.

Any of both the guide rollers 17 feeds the wound substrate W back to the side from which this substrate W is fed, and guides the substrate W to bring close to a part of this substrate conveyed toward the deposition roller corresponding to the guide roller 17. The guide roller brings a part of the substrate W to be wound up by the guide roller 17 and a part of the substrate W to be fed out from the guide roller 17 close to each other while leaving a narrow gap D. This narrow gap D serves as a gap flow passage 18 for distributing the source gas supplied from the gas supplying portion 7 to the plasma generating region 16. This gas flow passage 18 is connected to the plasma non-generating region 15, and the gas supplying portion 7 is provided in this plasma non-generating region 15.

Size of the gap D is preferably 0.1 to 20 millimeters for example. In order to inhibit or suppress inflow of the plasma P to the plasma non-generating region 15, the smaller size of the gap D is better. However, when the size is excessively small, pressure inside the plasma non-generating region 15 is increased, a film is expanded outward, and thereby, stable conveyance is disturbed. Thus, the size is preferably 0.1 millimeter or more. Conversely, when the size of the gap D is large, the plasma non-generating region hidden behind each of the deposition rollers 2A, 2B when seen from the plasma generating region 16 cannot be formed. Thus, the size is preferably 20 millimeters or less. Further, in order to also inhibit inflow of the plasma to the plasma non-generating region 15 due to diffusion of the plasma P, the size of the gap D may be 3 millimeters or less. In order to prevent contact between the upstream part and the downstream part of the substrate W due to wave or deflection of the substrate W, the size of the gap D is preferably 0.3 millimeters or more.

As shown in FIG. 3, each of the gas supplying portions 7 is a pipe shape member formed in a cylindrical shape in parallel to the deposition roller 2, and provided in the plasma non-generating region 15. An interior of the gas supplying portion 7 is hollow, and the source gas can be distributed to this interior. The gas supplying portion 7 has a nozzle portion (not shown) for jetting the source gas, and the source gas jetted from this nozzle portion to an exterior passes through the gap D formed between the upstream part and the downstream part of the substrate W and reaches to the plasma generating region 16 formed between both the deposition rollers 2A, 2B.

The plasma CVD apparatus 1 according to this embodiment includes blocking plates 19 for respectively covering both ends in the roll width direction of the plasma non-generating region 15. These blocking plates 19 inhibit movement of the source gas to an interior of the plasma non-generating region 15 from a part other than the gap D described above. However, in the present invention, the blocking plates are not necessarily provided.

This plasma CVD apparatus 1 has the following characteristics regarding each of the plasma non-generating regions 15.

(1) The plasma non-generating region 15 is placed on the opposite side of the plasma generating region 16 with respect to the deposition roller 2. Thus, the plasma non-generating region does not directly face the plasma generating region 16. That is, the plasma P does not directly reach to the plasma non-generating region 15 from the plasma generating region 16.

(2) The plasma non-generating region 15 is surrounded by the guide roller 17 to which no power is supplied and the insulating substrate W wound around this guide roller 17. Thus, the power is not supplied to the interior of the plasma non-generating region 15, and there is no fear that the plasma P is generated.

(3) The plasma non-generating region 15 is surrounded by the guide roller 17, the upstream part of the substrate W brought toward this guide roller 17, and the downstream part of the substrate W fed out from this guide roller 17. Thus, the plasma P cannot physically come in and out from the interior of the plasma non-generating region 15 from the part other than the gap D between the upstream part and the downstream part. Moreover, as described above, an outward flow of the source gas jetted from the gas supplying portion 7 is formed in this gap D, and this flow inhibits the inflow of the plasma P to the plasma non-generating region 15.

That is, in the plasma CVD apparatus 1 of the present embodiment, the plasma non-generating regions 15 in which there is no direct scatter or inflow of the plasma P and the plasma P is not generated in the interior are formed, and the gas supplying portions 7 are provided in the plasma non-generating regions 15. Thus, deposition on the gas supplying portions 7 is prevented. Therefore, in the plasma CVD apparatus 1, generation of flakes due to accumulation of extra coatings deposited on the gas supplying portions 7 is prevented, and deterioration of the quality of the CVD coating deposited on the substrate W due to peel-off and mixing of the flakes is prevented. As a result, the CVD coating excellent in quality can be deposited.

Next, a second embodiment of the present invention will be described.

Figure 6:
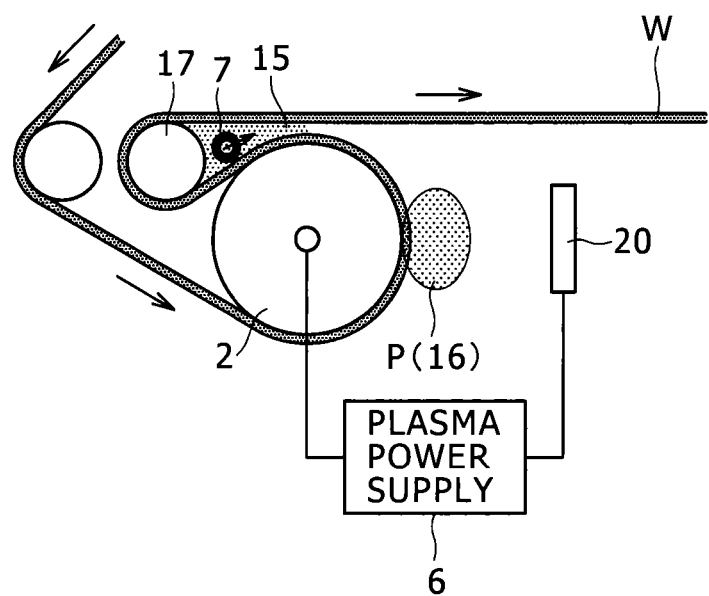
FIG. 6 A front view of a plasma CVD apparatus according to a second embodiment of the present invention.

A plasma CVD apparatus 1 according to this second embodiment includes a single deposition roller 2, and a flat plate shape counter electrode 20 as shown in FIG. 6 in place of the deposition rollers 2A, 2B according to the first embodiment. The magnetic field generating portion 8 is not provided in any of the deposition roller 2 and the counter electrode 20. The plasma power supply 6 is connected to the counter electrode 20 and the first deposition roller 2A, so as to generate a glow discharge between the first deposition roller 2A and the counter electrode 20 and generate the plasma P in the plasma generating region 16 between the deposition roller 2 and the counter electrode 2. Thereby, the CVD coating is deposited on the substrate W wound around the first deposition roller 2A. As well as the first embodiment, the guide roller 17 is provided in correspondence with the deposition roller 2, and this guide roller 17 forms the plasma non-generating region 15 with the substrate W.

As shown in FIG. 6, the gas supplying portion 7 is provided in the plasma non-generating region 15 on the opposite side of the plasma generating region 16 with respect to the deposition roller 2. Therefore, for the same reasons as (1) to (3) described above, contact of the plasma P with the gas supplying portion 7 is prevented, and generation of flakes on the gas supplying portion 7 and deterioration of the quality of the CVD coating due to mixing of the flakes are prevented.

This second embodiment shows that the technique of the present invention for suppressing the deposition on the gas supplying portion 7 can be applied even to the apparatus including only the single deposition roller 2, in other words, the apparatus 1 for performing the deposition by utilizing Penning discharge.

Figure 7:
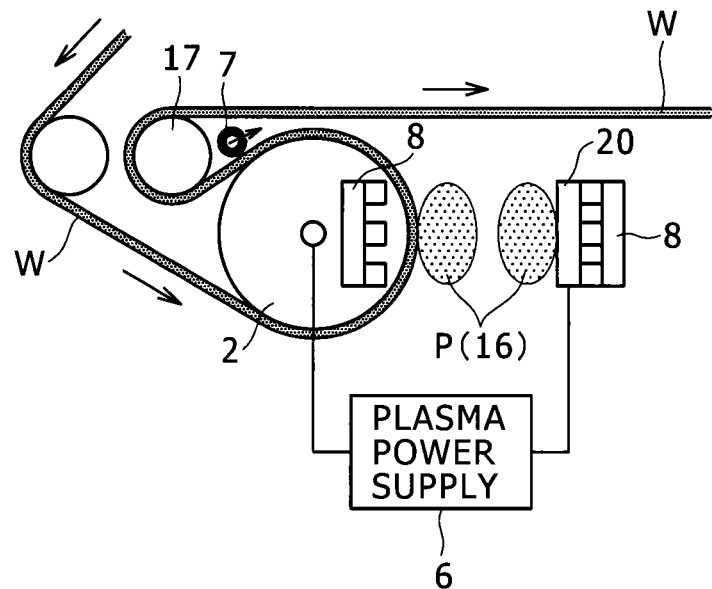
FIG. 7 A front view showing a modified example of the second embodiment.

In this second embodiment, a magnetic field generating portion can also be provided. For example, as shown in FIG. 7, by providing the magnetic field generating portion 8 on a back surface of the counter electrode 20, the plasma P can also be converged in the vicinity of a surface of the electrode. This convergence of the plasma P more limits a range of the plasma generating region 16 so that the gas supplying portion 7 can be reliably isolated from the plasma P. Thereby, unnecessary deposition on the gas supplying portion 7 is suppressed, so that stability of the quality of the CVD coating and productivity of the deposition can be increased.

Next, a third embodiment of the present invention will be described.

Figure 8:
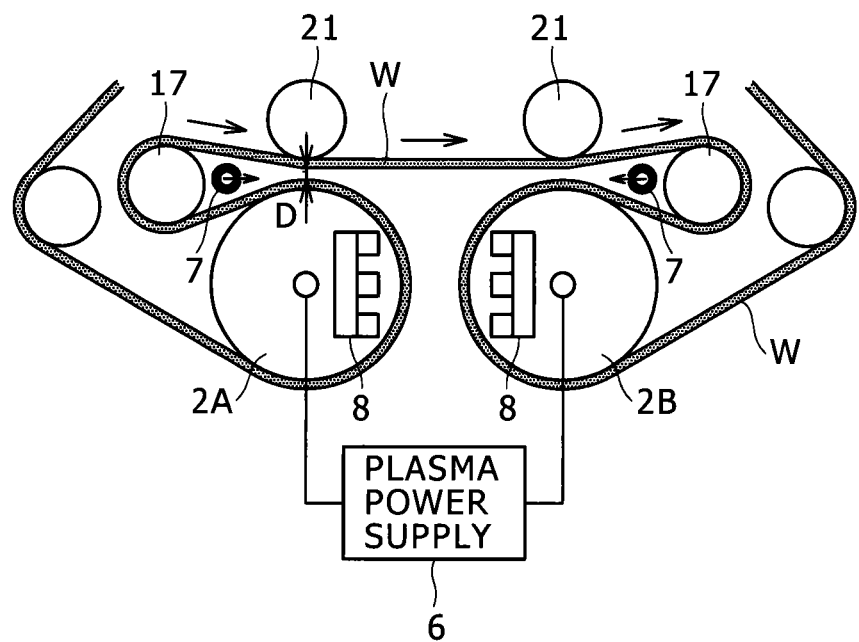
FIG. 8 A front view of a plasma CVD apparatus according to a third embodiment of the present invention.

As shown in FIG. 8, a plasma CVD apparatus 1 according to this third embodiment has the first deposition roller 2A and the second deposition roller 2B as well as the first embodiment but includes positioning rolls 21 in correspondence with and in parallel to the deposition rollers 2A, 2B. Each of the positioning rolls 21 performs positioning the so as to adjust the size of the gap D between the upstream part of substrate W fed to the guide roller 17 and the downstream part fed out from the guide roller 17. Thereby, a flow rate of the source gas flowing through the gap D, that is, the gas flow passage 18 can be adjusted.

The substrate W is in contact with outer peripheral surfaces of the positioning rolls 21. These positioning rolls 21 are brought close to or away from the deposition rollers 2A, 2B while keeping parallelism between axes thereof and the axes of the deposition rollers 2A, 2B, so that an area of the gas flow passages can be changed, that is, the flow rate of the source gas in the gaps D can be changed. When the size of the gaps D is excessively small, the flow rate of the source gas flowing through the gas flow passages 18 is reduced and the plasma P is not sufficiently generated, so that the deposition of the CVD coating becomes insufficient. In a case where the size of the gaps D is excessively large, the plasma P is easily attached to the gas supplying portions 7, so that the CVD coating excellent in quality is not easily deposited. Therefore, by adjusting the gaps D (flow rate of the gas flow passages 18) with using the positioning rolls 21, the CVD coating excellent in quality can be obtained with high productivity. The positioning rolls 21 also provide an effect of easily performing adjustment of the gaps D which is usually not easily performed due to tremor or wave of the substrate W (such as a film) described above.

Figure 9:
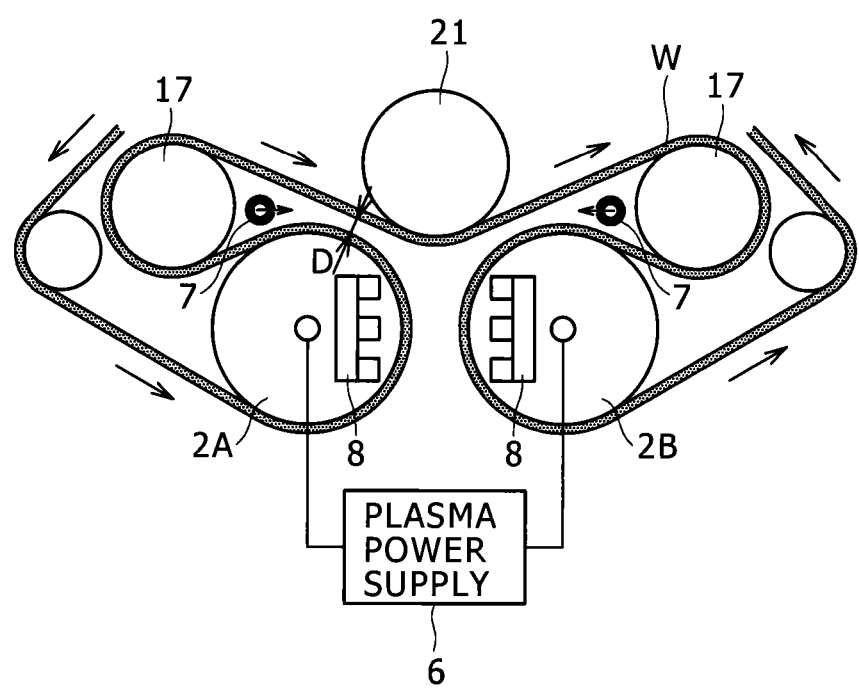
FIG. 9 A front view showing a modified example of the third embodiment.

In FIG. 8, one guide roller 17 is provided for each of the deposition rollers 2A, 2B, so that deposition speed of the CVD coating deposited in the first forming rollers 2A, 2B can be adjusted. However, as shown in FIG. 9, one positioning roll 21 may be provided between both the deposition rollers 2A, 2B. In this case, while keeping the positioning roll 21 and the pair of deposition rollers 2A, 2B equidistant from each other, the positioning roll 21 may be arranged so as to pass on a bisector of a line between the axes of the pair of deposition rollers 2A, 2B. The positioning roll 21 is not always limited to the positioning roll to be brought close to or away from the deposition rollers while in parallel to the deposition rollers 2A, 2B. For example, a position of the positioning roll 21 may be changed by adjusting a position of an attachment tool or the like, or the position of the positioning roll 21 may be changed by replacing a fixing tool of the positioning roll 21.

Although the size of the gaps D is differentiated by deposition conditions, the size is generally preferably about 0.1 to 20 mm, and the most preferably about 0.3 to 3 mm.

Although the pair of deposition rollers 2A, 2B shown in FIG. 1 and the like has the same diameter and the same axial length as each other, the present invention is not limited to this. Although parallelism between the axes of the deposition rollers 2A, 2B is preferable, the present invention is not limited to this. Alternatively, the pair of deposition rollers may be disposed so as to be spaced from each other in the direction other than the horizontal direction such as the up and down direction.

As described above, according to the present invention, a plasma CVD apparatus capable of preventing unnecessary deposition on a supplying portion of a source gas so as to suppress generation of flakes, and thereby depositing a CVD coating excellent in quality is provided. This plasma CVD apparatus includes a vacuum chamber whose interior is hollow, a vacuum pump system for vacuuming the interior of the vacuum chamber, a deposition roller around which a substrate serving as a deposition object is wound, the deposition roller being disposed in the vacuum chamber, a gas supplying portion for supplying the source gas to the interior of the vacuum chamber, and a plasma power supply for forming a plasma generating region in the vicinity of a surface of the deposition roller and thereby depositing a coating on the substrate wound around the deposition roller, wherein the gas supplying portion is provided in a plasma non-generating region positioned on the opposite side of the plasma generating region with respect to the deposition roller.

This invention is achieved focusing on a point that by providing the gas supplying portion in the plasma non-generating region where the gas supplying portion is not in contact with plasma, the generation of the flakes in the gas supplying portion can be suppressed and there is no fear that the quality of the CVD coating is deteriorated due to mixing of the generated flakes. Furthermore, while the plasma non-generating region is only a dead space in conventional apparatuses, the present invention can improve the quality of the CVD coating while effectively utilizing this dead space.

Preferably, the apparatus according to the present invention further includes a guide roller insulated from the plasma power supply and provided on the opposite side of the plasma generating region with respect to the deposition roller, the guide roller for guiding the non-conductive substrate wound around the deposition roller close to a part of the substrate to be conveyed toward the deposition roller. This guide roller can form the plasma non-generating region surrounded by the guide roller, the part of the substrate to be conveyed toward the deposition roller, and a part of the substrate to be fed out from the guide roller. This plasma non-generating region is formed on the opposite side of the plasma generating region with respect to the deposition roller and physically blocked from the plasma generating region. Thus, by providing the gas supplying portion in the plasma non-generating region, deposition on the gas supplying portion due to an influence of the plasma generated in the deposition roller is prevented. Since all the non-conductive substrate, the guide roller, and a space surrounded by these are insulated from the plasma power supply, the plasma is not generated as they are. Therefore, installment of the gas supplying portion in this plasma non-generating portion is effective for preventing an adverse influence on stability of the quality of the CVD coating due to the generation of the flakes.

Further, preferably, the guide roller is arranged in such a manner that a gap is formed between an upstream part of the substrate brought toward the guide roller and a downstream part fed from the guide roller, and the gap serves as a gas flow passage through which the source gas supplied from the gas supplying portion is distributed to the plasma generating region. This gas flow passage is formed by the substrate covering the surface of the deposition roller. Thus, the substrate can inhibit direct contact of the source gas flowing through the gas flow passage with the surface of the deposition roller, so that generation of flakes on the surface of the deposition roller due to the contact can be effectively suppressed. A flow of the source gas brought toward the plasma generating region in this gas flow passage suppresses inflow of the plasma to the plasma non-generating region.

Further, in this case, more preferably, the apparatus includes a positioning roller capable of performing positioning so as to change size of the gap between the upstream part and the downstream part of the substrate. With this positioning roller, by changing the size of the gap, a flow rate of the source gas in the gas flow passage can be adjusted, so that deposition speed of the CVD coating can be adjusted.

In the plasma CVD apparatus according to present invention, preferably, a first deposition roller and a second deposition roller provided so as to be horizontally spaced from the first deposition roller in such a manner that an axis thereof is parallel to an axis of the first deposition roller are provided as the deposition roller, and the guide rollers are respectively provided in the deposition rollers.

Meanwhile, preferably, the plasma CVD apparatus according to the present invention includes a magnetic field generating portion provided inside the deposition roller for generating a magnetic field for converging plasma on the surface of the deposition roller. In this case, favorably, the magnetic field generating portion includes a first magnet formed for example in a rod shape, the first magnet extending along the axial direction of the deposition roller, and a second magnet formed in a shape surrounding the first magnet when the first magnet is seen from the direction orthogonal to the longitudinal direction thereof, such as a race-track shape, and the first and second magnets are arranged in such a manner that one of both magnetic poles of the first magnet faces the plasma generating region, and one of both magnetic poles of the second magnet, the magnetic pole being opposite to the magnetic pole of the first magnet facing the plasma generating region faces the plasma generating region, so that a magnetic field having a magnetic line closed between the first and second magnets is generated. The magnetic line generated between the first magnet and the second magnet can limit a plasma generating place to one part of the surface of the deposition roller. Thereby, the supplying portion of the source gas and the region where the plasma is generated are easily isolated, so that the generation of the flakes in the supplying portion of the source gas is more reliably suppressed.

In the apparatus including the first and second deposition rollers, the magnetic field generating portions may be respectively provided inside the first and second deposition rollers, and arranged so as to generate magnetic fields for converging plasma on parts of surfaces of the first and second deposition rollers, the parts facing each other.

The invention claimed is:

1. A plasma CVD apparatus, comprising:
   a vacuum chamber whose interior is hollow;
   a vacuum pump system for vacuuming the interior of said vacuum chamber;
   a pair of deposition rollers disposed in said vacuum chamber and arranged such that axes thereof extend in a horizontal direction and in parallel to each other, wherein the axes are spaced from each other in the horizontal direction and in a direction orthogonal to the axes;
   a substrate wound around the deposition rollers;
   a gas supplying portion for supplying a source gas to the interior of said vacuum chamber;
   a plasma power supply for forming a plasma generating region between said pair of deposition rollers and in the vicinity of a surface of one of said deposition rollers, thereby depositing a coating on a surface of the substrate wound around said one of said deposition rollers, wherein said gas supplying portion is provided in a plasma non-generating region such that the one of the deposition rollers is provided between the plasma generating region and the plasma non-generating region; and
   a guide roller for guiding the substrate, which guide roller is insulated from said plasma power supply and is provided on the opposite side of the plasma generating region with respect to said one of said deposition rollers,
   a flow passage provided between the plasma generating region and the plasma non-generating region, through which the source gas supplied from said gas supplying portion in said plasma non-generating region is distributed to the plasma generating region,
   wherein a dimension of said flow passage is defined by the relative positions of the guide roller and one of the deposition rollers, and wherein the dimension of said flow passage is set to be capable of inhibiting the flow of plasma from the plasma generating region to the plasma non-generating region.

2. The plasma CVD apparatus according to claim 1 wherein said flow passage is equal to or less than 20 mm.

3. The plasma CVD apparatus according to claim 1 wherein said flow passage is equal to or less than 3 mm.

4. The plasma CVD apparatus according to claim 1, further comprising:
   a positioning roller capable of performing positioning so as to change size of the gap.

5. The plasma CVD apparatus according to claim 1, wherein said guide roller comprises a pair of guide rollers respectively provided in correspondence with said deposition rollers.

6. The plasma CVD apparatus according to claim 1, comprising:
   a magnetic field generating portion provided inside said one of said deposition rollers for generating a magnetic field for converging plasma on the surface of said one of said deposition rollers.

7. The plasma CVD apparatus according to claim 6, wherein said magnetic field generating portion includes a first magnet formed in a rod shape, the first magnet extending along the axial direction of said one of said deposition rollers, and a second magnet surrounding said first magnet when said first magnet is seen from the direction orthogonal to the longitudinal direction thereof, and said first and second magnets are arranged in such a manner that one of both magnetic poles of said first magnet faces the plasma generating region, and one of both magnetic poles of said second magnet, having a polarity opposite to the magnetic pole of said first magnet facing the plasma generating region, faces the plasma generating region, so that a magnetic field having a magnetic line closed between the first and second magnets is generated.

8. The plasma CVD apparatus according to claim 6, wherein said pair of deposition rollers comprise a first deposition roller and a second deposition roller, and said magnetic field generating portions are respectively provided inside said first and second deposition rollers, and arranged so as to generate magnetic fields for converging plasma on parts of surfaces of said first and second deposition rollers, the parts facing each other.

\* \* \* \* \*